United States Patent [19] [11] 3,887,379
Clecak et al. [45] June 3, 1975

[54] PHOTORESIST AZIDE SENSITIZER COMPOSITION

[75] Inventors: Nicholas J. Clecak, San Jose; Robert J. Cox, Los Gatos, both of Calif.

[73] Assignee: International Business Machines Corporation, Armonk, N.Y.

[22] Filed: Aug. 15, 1973

[21] Appl. No.: 388,706

Related U.S. Application Data

[62] Division of Ser. No. 239,794, March 30, 1972, abandoned.

[52] U.S. Cl. 96/115 R; 96/35.1; 96/91 N; 96/129; 96/130; 260/349
[51] Int. Cl. G03f 7/08; G03c 1/72
[58] Field of Search 96/91 N, 115 R, 35.1, 129, 96/130; 260/349

[56] References Cited

UNITED STATES PATENTS

| | | | |
|---|---|---|---|
| 2,732,301 | 1/1956 | Robertson | 96/115 R |
| 2,852,379 | 9/1958 | Hepher et al. | 96/91 N |
| 2,884,326 | 4/1959 | Zemp | 96/91 R |
| 3,075,950 | 1/1963 | Newland et al. | 96/91 N |
| 3,099,558 | 7/1963 | Levinos | 96/91 R |
| 3,475,176 | 10/1969 | Rauner | 96/91 N |
| 3,539,559 | 11/1970 | Ruckert | 96/91 N |
| 3,558,609 | 1/1971 | Ruckert | 96/91 N |
| 3,567,453 | 3/1971 | Borden | 96/91 N |
| 3,591,378 | 7/1971 | Altman | 96/91 N |
| 3,598,586 | 10/1971 | Gaspar | 96/91 N |
| 3,721,566 | 3/1973 | Laridon et al. | 96/91 N |

FOREIGN PATENTS OR APPLICATIONS

| | | | |
|---|---|---|---|
| 886,100 | 1/1962 | United Kingdom | 96/91 N |

OTHER PUBLICATIONS

Clecak et. al., "IBM Tech. Discl Bulletin," Vol. 13, No. 5, 10/1970, p. 1,274.
Grant, J., "Hackh's Chemical Dictionary," 4th. Ed., 1969, p. 192.
Mees, "The Theory of the Photographic Processes," 3rd Ed., 1966, pp. 201–204, 216–217, and 223–227.
Patent Office Class Definitions, Class 96, Subclass 120.

*Primary Examiner*—Charles L. Bowers, Jr.
*Attorney, Agent, or Firm*—Joseph G. Walsh

[57] ABSTRACT

The light sensitivity and adhesion of photoresist compositions is improved by incorporating in them a sensitizer which is cyanine dye, said dye having at least one azido group substituted on an aromatic ring.

5 Claims, No Drawings

PHOTORESIST AZIDE SENSITIZER COMPOSITION

The present application is a divisional application of copending application Ser. No. 239,794, filed Mar. 30, 1972 and now abandoned.

FIELD OF THE INVENTION

The present application is concerned with photoresist compositions. In particular it is concerned with improving the photosensitivity and adhesion of such compositions to a substrate such as metal or the like. These objectives are accomplished by incorporating in the photoresist compositions certain photosensitive compounds having a specified chemical structure.

PRIOR ART

Many photoresist compositions are known to the prior art as may be seen for example in the following U.S. Pat. Nos. 2,852,379; 3,024,180; 3,081,168; 3,143,423; and 3,551,160. The compositions of the present invention represent an unexpected improvement over the prior art in that they improve the adhesion of the photoresist compositions to the substrate and also increase photosensitivity.

SUMMARY OF INVENTION

A typical photoresist composition contains, a photosensitive polymer, for example poly-(2-chlor-1,3-butadiene). The photosensitive polymer, usually dissolved in a suitable solvent along with a colloidal binder, is coated on a substrate, for example, metal. Imagewise exposure to light results in creation of a pattern in the coating composition. Treatment with proper solvent removes the unhardened portion and creates the photoresist image.

Where the photoresist film does not properly adhere to the substrate, undesirable deterioration of image quality occurs. Accordingly, it is an objective of the present invention to increase the adhesion of a photoresist film to the substrate.

It is also an objective of the present invention to increase the photosensitivity of photoresist compositions.

These and other objectives are accomplished by incorporating in the photoresist compositions certain sensitizers. The sensitizers useful in the present invention are cyanine dyes. These dyes must also have at least one azido group substituted on an aromatic ring. While the mechanism of their action is not understood, it is postulated that upon exposure to light the sensitizing dyes decompose, and this decomposition leads to cross-linking to the substrate, thereby promoting adhesion.

Many polymer compositions are known in the art as photoresists. The sensitizers of the present invention are suitable for use with all such compositions. In addition to the polymer and the sensitizer, photoresist composition may, when it is desirable, also contain additional ingredients, such as binders, anti-oxidants, plasticizers and the like. In general, only a small amount, say from about 0.5 to about 10 percent by weight of sensitizer is required in the photoresist compositions.

The following Examples are given solely for purposes of illustration and are not to be considered limitations on the invention, many variations of which are possible without departing from the spirit or scope thereof.

EXAMPLE I

6-Azido-2-(4-p-dimethylaminophenyl-2,4-butadienyl)-N-methylbenzenethiazolium iodide having the formula

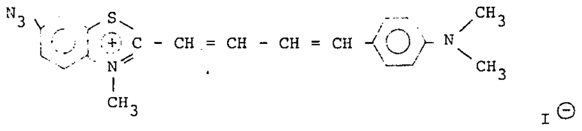

6-Azido-2-methylbenzenethiazole was prepared from the amine (C.A. 1963, 2348) in the usual manner. It was refluxed for 6 hours with methyl iodide to form the quaternary salt. The precipitate was washed with ether and dried. It was pure by TLC and melted at 205° with decomposition. One gram of base gave 9.65 g. of salt.

Calcd. for $C_9H_9N_4SI$: C, 32.54; H, 2.73; N, 16.87; S, 9.65; I, 38.20. Found: C, 32,44; H, 2.77; N, 16.59; S, 9.41; I, 37.72.

A solution of 6.5 g. of p-dimethylaminocinnamaldehyde and 3.4 g. of the above quaternary salt were refluxed in 300 ml. of ethanol for 24 hours. The reaction mixture was filtered hot, the precipitate washed with ethanol and dried. A blue solid was obtained which weighed 3.7 g. had an azide group present (infrared), was pure by TLC and had a visible absorption with a maximum at 5,800A. Combustion analysis showed it to be the title compound.

Calcd. for $C_{20}H_{20}N_5SI$: C, 49.08; H, 4.12; N, 14.31; S, 6.55; I, 25.93. Found: C, 49.19; H, 4.49; N, 14.30; S, 6.69; I, 25.88.

EXAMPLE II

6-Azido-3-methyl-2-3-[3-(6-azido-3-methylbenzothiazolylidene)propene]benzothiazolium iodide having the formula

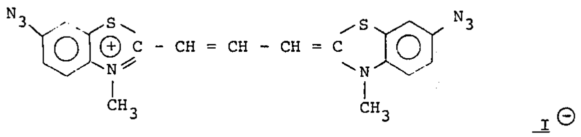

A solution of 4.5 g. of 6-azido-3-methylbenzenethiazolium iodide, 4.1 g. of triethylorthoformate in 200 ml. of acetic anhydride was heated to reflux for 1μ of an hour. The reaction mixture was filtered hot and the solids were dissolved in dimethylformamide then precipitated by the addition of ether. The dark crystals were ether washed and dried. They were pure by TLC and combustion analysis.

Calcd. for $C_{19}H_{15}N_8S_2I$: C, 41.76; H, 2.76; N, 20.51; S, 11.73; I, 23.22. Found: C, 41.80; H, 2.91; N, 20.38; S, 11.63; I, 23.18.

EXAMPLE III

6-Azido-3-methyl-2-(p-dimethylaminostyryl) benzenethiazolium iodine having the formula

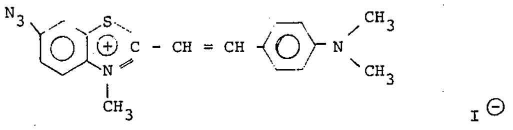

A solution of 1.6 g. of 6-azido-3-methylbenzenethiazolium iodide and 3.0 g. of p-dimethylaminobenzaldehyde in 100 ml. of ethanol was refluxed for 24 hours. The reaction mixture was hot filtered, washed with ether and hot acetone and dried. The dark solid weighed 1.8 g., was pure by TLC and combustion analysis.

Calcd, for $C_{18}H_{18}N_5SI$: C, 46.65; H, 3.91; N, 15.11; S, 6.91; I, 27.39. Found: C, 46.7; H, 3.9; N, 15.0; S, 6.8; I, 27.3.

EXAMPLE IV

N-Methyl-4-(6-azido-3-methyl-2-benzenethiazolylidenemethylene) quinolinium iodide having the formula

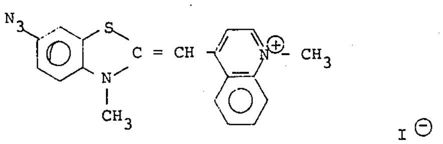

1.6 g. of 6-azido-2-methylbenzenethiazole, 4.0 g. of N-methylquinolium iodide and 1 g. of potassium hydroxide were refluxed for ½ hour in 300 ml. of methanol. The reaction mixture was filtered hot and the dark solid washed with acetone, ether and dried. The yield of pure product was 1.1 g.

Calcd. for $C_{19}H_{16}N_5SI$: C, 48.4; H, 3.4; N, 14.8; S, 6.7; I, 26.8. Found: C, 48.0; H, 3.6; N, 14.6; S, 6.6; I, 26.7.

EXAMPLE V

The following formulation exemplifies the use of these new sensitizers for use in photoresist compositions:

10.g of poly-(2-chloro-1.3-butadiene)

10.g of polyketone 2KRA-0252 (Union Carbide Co.)

0.9 g. triethanolamine 0.2 g. phenyl B-naphthylamine 1.0 g. of 6-Azido-2-(4-p-dimethylaminophenyl-2,4-butadienyl)-N-methylbenzenethiazolium iodide. Ingredients dissolved in xylene and made up to a total volume of 100 ml.

What is claimed is:

1. A negative resist composition comprising a poly-(2-chlor-1,3-butadiene) and in an amount of from 0.5 to 10 percent by weight of the weight of the photosensitive polymer, a photosensitizer selected from the group consisting of 6-Azido-2-(4-p-dimethylaminophenyl-2,4-butadienyl(-N-methylbenzenthiazolium iodide, 6-Azido-3-methyl-2-3-[3-(6-azido-3-methylbenzothiazolylidene) propene]benzothiazolium iodide, 6-Azido-3-methyl-2-(p-dimethylaminostyryl) benzenethiazolium iodide, and N-Methyl-4-(6-azido-3-methyl-2-benzenethiazolylidenemethylene) quinolinium iodide.

2. A photoresist composition as claimed in claim 1 wherein the photosensitizer is 6-azido-2-(4-p-dimethylaminophenyl-2,4-butadienyl)-N-methylbenzenethiazolium iodide.

3. A photoresist composition as claimed in claim 1 wherein the photosensitizer is 6-azido-3-methyl-2-[3-(6-azido-3-methylbenzothiazolylidene) propene]benzothiazolium iodide.

4. A photoresist composition as claimed in claim 1 wherein the photosensitizer is 6-azido-3-methyl-2-(p-dimethylaminostyryl) benzenethiazolium iodide.

5. A photoresist composition as claimed in claim 1 wherein the photosensitizer is N-Methyl-4-(6-azido-3-methyl-2-benzenethiazolylidenemethylene) quinolinium iodide.

* * * * *